US012446362B2

(12) United States Patent
Choi et al.

(10) Patent No.: US 12,446,362 B2
(45) Date of Patent: Oct. 14, 2025

(54) NANOROD LIGHT EMITTING DEVICE, METHOD OF MANUFACTURING THE SAME, AND DISPLAY APPARATUS INCLUDING THE SAME

(71) Applicant: SAMSUNG ELECTRONICS CO., LTD., Suwon-si (KR)

(72) Inventors: Junhee Choi, Seongnam-si (KR); Joohun Han, Hwaseong-si (KR); Nakhyun Kim, Yongin-si (KR); Joosung Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 862 days.

(21) Appl. No.: 17/529,636

(22) Filed: Nov. 18, 2021

(65) Prior Publication Data

US 2022/0416122 A1    Dec. 29, 2022

(30) Foreign Application Priority Data

Jun. 23, 2021   (KR) .................. 10-2021-0081800

(51) Int. Cl.
*H10H 20/819*   (2025.01)
*H10H 20/817*   (2025.01)
*H10H 20/833*   (2025.01)

(52) U.S. Cl.
CPC ........ *H10H 20/819* (2025.01); *H10H 20/817* (2025.01); *H10H 20/833* (2025.01)

(58) Field of Classification Search
CPC .......... H01L 33/20; H01L 33/16; H01L 33/42
See application file for complete search history.

(56) References Cited

U.S. PATENT DOCUMENTS

| | | | |
|---|---|---|---|
| 8,183,576 B2 | 5/2012 | Min et al. | |
| 8,420,439 B2 | 4/2013 | Lugauer et al. | |
| 2009/0098714 A1 | 4/2009 | Chang et al. | |
| 2010/0271831 A1 | 10/2010 | Kosowsky et al. | |
| 2011/0108873 A1 | 5/2011 | Richardson et al. | |
| 2011/0114915 A1 | 5/2011 | Lee et al. | |
| 2012/0223289 A1* | 9/2012 | Gwo ................... | H01L 33/18 438/35 |
| 2013/0026506 A1 | 1/2013 | Arbell | |
| 2018/0175248 A1* | 6/2018 | Ahmed ............... | H01L 25/0753 |

(Continued)

FOREIGN PATENT DOCUMENTS

| | | | |
|---|---|---|---|
| JP | 2009-076896 A | 4/2009 | |
| JP | 2012-507840 A | 3/2012 | |

(Continued)

OTHER PUBLICATIONS

Communication dated May 23, 2022, issued by the European Patent Office in counterpart European Application No. 21211113.2.

(Continued)

*Primary Examiner* — Mark W Tornow
(74) *Attorney, Agent, or Firm* — Sughrue Mion, PLLC

(57) ABSTRACT

A nanorod light emitting device includes a semiconductor light emitting nanorod, and a passivation film surrounding a sidewall of the semiconductor light emitting nanorod and having insulating properties, wherein the passivation film includes an insulating crystalline material having a same crystal structure as a crystal structure of the semiconductor light emitting nanorod.

16 Claims, 21 Drawing Sheets

(56) References Cited

U.S. PATENT DOCUMENTS

2019/0355868 A1    11/2019  Fimland et al.
2021/0151498 A1*    5/2021  Tyagi ...................... H01L 33/06

FOREIGN PATENT DOCUMENTS

| KR | 10-2009-0038348 A | 4/2009 |
| KR | 10-2010-0028412 A | 3/2010 |

OTHER PUBLICATIONS

Liang-Yi Chen et al., "On the Efficiency Decrease of the GaN Light-Emitting Nanorod Arrays", IEEE Journal of Quantum Electronics, vol. 49, No. 2, Feb. 2013, pp. 224-231, 9 pages total.

* cited by examiner

NANOROD LIGHT EMITTING DEVICE, METHOD OF MANUFACTURING THE SAME, AND DISPLAY APPARATUS INCLUDING THE SAME

CROSS-REFERENCE TO RELATED APPLICATION

This application is based on and claims priority under 35 U.S.C. § 119 to Korean Patent Application No. 10-2021-0081800, filed on Jun. 23, 2021, in the Korean Intellectual Property Office, the disclosure of which is incorporated by reference herein in its entirety.

BACKGROUND

1. Field

The disclosed embodiments relate to a nanorod light emitting device with improved luminous efficiency and a method of manufacturing the same. Further, the disclosed embodiments relate to a display apparatus including a nanorod light emitting device.

2. Description of Related Art

Light emitting diodes (LEDs) are known as the next-generation of light sources due to their advantages such as long lifespan, low power consumption, fast response speed, and environmental friendliness compared to conventional light sources. Because of these advantages, the industrial demand for LEDs is increasing. LEDs are generally applied and used in various products such as lighting devices and backlights of display apparatuses.

Recently, micro-units or nano-units of micro LEDs using group II-VI or group III-V compound semiconductors have been developed. In addition, micro LED displays including micro LEDs directly used as light emitting elements of display pixels have been developed. However, when LEDs are miniaturized to micro or nano units as described above, the luminous efficiency of the LEDs may be reduced due to a surface defect.

SUMMARY

Provided is a nanorod light emitting device with improved luminous efficiency by reducing surface defects.

Also, provided is a method of manufacturing a nanorod light emitting device capable of reducing surface defects.

In addition, provided is a display apparatus including a nanorod light emitting device.

Additional aspects will be set forth in part in the description which follows and, in part, will be apparent from the description, or may be learned by practice of embodiments of the disclosure.

In accordance with an aspect of the disclosure, a nanorod light emitting device includes a semiconductor light emitting nanorod; and a passivation film surrounding a sidewall of the semiconductor light emitting nanorod and having insulating properties, wherein the passivation film includes an insulating crystalline material having a substantially same crystal structure as a crystal structure of the semiconductor light emitting nanorod.

The passivation film may have a lattice matching epitaxy relationship or a domain matching epitaxy relationship with the semiconductor light emitting nanorod.

A difference between a lattice constant of the passivation film and a lattice constant of the semiconductor light emitting nanorod may be within ±30% of the lattice constant of the semiconductor light emitting nanorod.

A difference between a lattice constant of the passivation film and an integer multiple of a lattice constant of the semiconductor light emitting nanorod may be within ±30% of the lattice constant of the semiconductor light emitting nanorod.

An energy bandgap of the passivation film may be greater than an energy bandgap of the semiconductor light emitting nanorod.

The passivation film may include at least one from among ZrO, SrO, MgO, BaO, $CeO_2$, $Gd_2O_3$, CaO, $HfO_2$, $TiO_2$, $AlO_x$, BaN, SiN, TiN, CeN, AlN, ZnSe, ZnS, AlGaN, and $Al_xGa_{1-x}As$ (x≥0.9).

A thickness of the passivation film may be in a range of about 5 nm to about 20 nm.

The nanorod light emitting device may further include a protective film disposed between the semiconductor light emitting nanorod and the passivation film to directly surround the sidewall of the semiconductor light emitting nanorod, wherein the protective film includes an insulating crystalline material having the substantially same crystal structure as the crystal structure of the semiconductor light emitting nanorod.

An energy bandgap of the protective film may be greater than an energy bandgap of the semiconductor light emitting nanorod, and an energy bandgap of the passivation film may be greater than or equal to the energy bandgap of the protective film.

A thickness of the protective film may be in a range of about 0.5 nm to about 5 nm.

The nanorod light emitting device may further include an insulating film surrounding a sidewall of the passivation film, wherein the insulating film includes an amorphous insulating material.

A thickness of the insulating film may be in a range of about 40 nm to about 70 nm.

An energy bandgap of the insulating film may be greater than an energy bandgap of the passivation film.

The semiconductor light emitting nanorod may include a first semiconductor layer doped with a first impurity of a first conductivity type; a light emitting layer disposed on the first semiconductor layer; and a second semiconductor layer disposed on the light emitting layer and doped with a second impurity of a second conductivity type electrically opposite to the first conductivity type.

The semiconductor light emitting nanorod may further include a transparent electrode disposed on the second semiconductor layer.

The semiconductor light emitting nanorod may have a height in a range of about 1 µm to about 20 µm, and an outer diameter in a range of about 0.05 µm to about 2 µm.

In accordance with an aspect of the disclosure, a display apparatus includes a pixel electrode; a common electrode; and a nanorod light emitting device disposed between the pixel electrode and the common electrode, wherein the nanorod light emitting device includes a semiconductor light emitting nanorod; and a passivation film surrounding a sidewall of the semiconductor light emitting nanorod and having insulating properties, and wherein the passivation film includes an insulating crystalline material having a substantially same crystal structure as a crystal structure of the semiconductor light emitting nanorod.

In accordance with an aspect of the disclosure, a method of manufacturing a nanorod light emitting device includes forming a first semiconductor layer doped with a first impurity of a first conductivity type on a substrate; forming a light emitting layer on the first semiconductor layer; forming a second semiconductor layer on the light emitting layer, the second semiconductor layer being doped with a second impurity of a second conductivity type electrically opposite to the first impurity of the first conductivity type; forming a plurality of semiconductor light emitting nanorods by patterning the first semiconductor layer, the light emitting layer, and the second semiconductor layer; and forming a passivation film to surround sidewalls of the plurality of semiconductor light emitting nanorods, wherein the passivation film includes an insulating crystalline material having a substantially same crystal structure as a crystal structure of the plurality of semiconductor light emitting nanorods.

The forming of the passivation film may include depositing a material of the passivation film for 1 to 15 cycles by an atomic layer deposition method; heating and crystallizing the deposited material of the passivation film; and repeating the depositing of the material of the passivation film and the crystallizing of the deposited material of the passivation film for 1 to 10 cycles.

The crystallizing of the deposited passivation film material may use an argon (Ar) plasma method.

The passivation film may have a lattice matching epitaxy relationship or a domain matching epitaxy relationship with the plurality of semiconductor light emitting nanorods.

A difference between a lattice constant of the passivation film and a lattice constant of the plurality of semiconductor light emitting nanorods may be within ±30% of the lattice constant of the plurality of semiconductor light emitting nanorods.

A difference between a lattice constant of the passivation film and an integer multiple of a lattice constant of the plurality of semiconductor light emitting nanorods may be within ±30% of the lattice constant of the plurality of semiconductor light emitting nanorods.

An energy bandgap of the passivation film may be greater than an energy bandgap of the plurality of semiconductor light emitting nanorods.

The passivation film may include at least one from among ZrO, SrO, MgO, BaO, $CeO_2$, $Gd_2O_3$, CaO, $HfO_2$, $TiO_2$, $AlO_x$, BaN, SiN, TiN, CeN, AlN, ZnSe, ZnS, AlGaN, and $Al_xGa_{1-x}As$ (x≥0.9).

A thickness of the passivation film may be in a range of about 5 nm to about 20 nm.

The method may further include, before the forming of the passivation film, first forming a protective film to directly surround the sidewalls of the plurality of semiconductor light emitting nanorods, wherein the passivation film is formed to surround the plurality of semiconductor light emitting nanorods and the protective film, and wherein the protective film includes an insulating crystalline material having the substantially same crystal structure as the crystal structure of the plurality of semiconductor light emitting nanorods.

An energy bandgap of the protective film may be greater than an energy bandgap of the plurality of semiconductor light emitting nanorods, and an energy bandgap of the passivation film may be greater than or equal to the energy bandgap of the protective film.

A thickness of the protective film may be in a range of about 0.5 nm to about 5 nm.

The method may further include forming an insulating film surrounding a sidewall of the passivation film, wherein the insulating film includes an amorphous insulating material.

A thickness of the insulating film may be in a range of about 40 nm to about 70 nm.

An energy bandgap of the insulating film may be greater than an energy bandgap of the passivation film.

In accordance with an aspect of the disclosure, a cylindrical light emitting device includes a first cylindrical semiconductor layer; a second cylindrical semiconductor layer; a cylindrical active layer between the first cylindrical semiconductor layer and the second cylindrical semiconductor layer; and a passivation film surrounding a sidewall of the cylindrical active layer, wherein the passivation film comprises an insulating crystalline material, and wherein the first cylindrical semiconductor layer, the second cylindrical semiconductor layer, the cylindrical active layer, and the passivation film have a substantially same crystal structure.

The cylindrical light emitting device may have a height in a range of about 1 μm to about 20 μm, and an outer diameter in a range of about 0.05 μm to about 2 μm.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
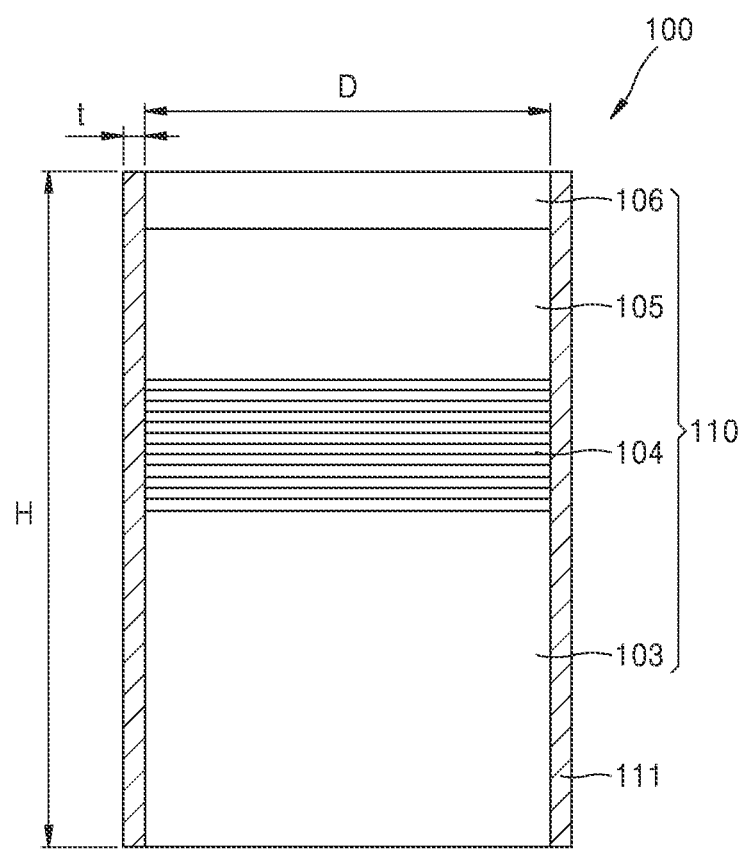
FIG. 1 is a cross-sectional view showing a schematic configuration of a nanorod light emitting device according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a nanorod light emitting device, a manufacturing method thereof, and a display apparatus including the nanorod light emitting device will be described in detail with reference to the accompanying drawings. In the following drawings, the same reference numerals refer to the same components, and the size of each component in the drawings may be exaggerated for clarity and convenience of description. Further, embodiments described below are merely examples, and various modifications are possible from these embodiments.

Hereinafter, what is described as "upper part" or "on" may include not only those directly above by contact, but also those above non-contact. The terms of a singular form may include plural forms unless otherwise specified. In addition, when a certain part "includes" a certain component, it means that other components may be further included rather than excluding other components unless otherwise stated.

The use of the term "the" and similar designating terms may correspond to both the singular and the plural. If there is no explicit order or contradictory statement about the steps constituting the method, these steps may be performed in any appropriate order, and are not necessarily limited to the order described.

In addition, terms such as "unit" and "module" described in the specification mean a unit that processes at least one function or operation, and this may be implemented as hardware or software, or may be implemented as a combination of hardware and software.

The connection or connection members of lines between the components shown in the drawings are illustrative of functional connections and/or physical or circuit connections, and may be represented as a variety of functional connections, physical connections, or circuit connections that are replaceable or additional in an actual device.

The use of all examples or illustrative terms is merely for describing technical ideas in detail, and the scope is not limited by these examples or illustrative terms unless limited by the claims.

FIG. 1 is a cross-sectional view showing a schematic configuration of a nanorod light emitting device according to an embodiment. Referring to FIG. 1, a nanorod light emitting device 100 according to an embodiment (e.g., a cylindrical light emitting device) may include a semiconductor light emitting structure 110 having a nanorod shape (e.g., a semiconductor light emitting nanorod), and a passivation film 111 surrounding the sidewall of the semiconductor light emitting structure 110 and having insulating properties.

The semiconductor light emitting structure 110 may include a first semiconductor layer 103 (e.g., a first cylindrical semiconductor layer), a light emitting layer 104 (e.g., a cylindrical active layer) disposed on the first semiconductor layer 103, and a second semiconductor layer 105 (e.g., a second cylindrical semiconductor layer) disposed on the light emitting layer 104. The semiconductor light emitting structure 110 may further include a transparent electrode 106 disposed on the second semiconductor layer 105. Also, the semiconductor light emitting structure 110 may further include a transparent contact layer disposed between the second semiconductor layer 105 and the transparent electrode 106.

The first semiconductor layer 103 and the second semiconductor layer 105 may be made of a group II-VI or a group III-V compound semiconductor material. The first semiconductor layer 103 and the second semiconductor layer 105 serve to provide electrons and holes to the light emitting layer 104. For this, the first semiconductor layer 103 may be doped with an n-type impurity or a p-type impurity (e.g., a first impurity), and the second semiconductor layer 105 may be doped with an impurity of a conductivity type that is electrically opposite to that of the first semiconductor layer 103 (e.g., a second impurity). For example, the first semiconductor layer 103 may be doped with an n-type impurity and the second semiconductor layer 105 may be doped with a p-type impurity, or the first semiconductor layer 103 may be doped with a p-type impurity and the second semiconductor layer 105 may be doped with an n-type impurity. When the first semiconductor layer 103 or the second semiconductor layer 105 is doped with an n-type impurity, for example, silicon (Si) may be used as a dopant, and when the first semiconductor layer 103 or the second semiconductor layer 105 is doped with a p-type impurity, for example, zinc (Zn) may be used as a dopant. The n-type doped first semiconductor layer 103 or second semiconductor layer 105 may provide electrons to the light emitting layer 104, and the p-type doped second semiconductor layer 105 or the first semiconductor layer 103 may provide holes to the light emitting layer 104.

The light emitting layer 104 has a quantum well structure in which quantum wells are disposed between barriers. Light may be generated as electrons and holes provided from the first and second semiconductor layers 103 and 105 are recombined in the quantum well in the light emitting layer 104. The wavelength of light generated from the light emitting layer 104 may be determined according to the energy bandgap of the material constituting the quantum well in the light emitting layer 104. The light emitting layer 104 may have only one quantum well, or may have a multi-quantum well (MQW) structure in which a plurality of quantum wells and a plurality of barriers are alternately arranged. The thickness of the light emitting layer 104 or the number of quantum wells in the light emitting layer 104 may be appropriately selected in consideration of the driving voltage and luminous efficiency of the nanorod light emitting device 100. For example, the thickness of the light emitting layer 104 may be selected to be equal to or less than twice the diameter D of the semiconductor light emitting structure 110.

The semiconductor light emitting structure 110 may have a nanorod shape having a very small size of a nano-scale or a micro-scale. For example, the semiconductor light emitting structure 110 may have a diameter D in a range of about 0.05 μm to about 2 μm. The semiconductor light emitting structure 110 having a nanorod shape may have a substantially uniform diameter along the height direction. For example, diameters of the first semiconductor layer 103, the light emitting layer 104, the second semiconductor layer 105, and the transparent electrode 106 may be substantially the same. Also, when the length between the lower surface of the first semiconductor layer 103 and the upper surface of the second semiconductor layer 105, or the length between the lower surface of the first semiconductor layer 103 and the upper surface of the transparent electrode 106 is the height H of the semiconductor light emitting structure 110, the height H of the semiconductor light emitting structure 110 may be in a range of about 1 µm to about 20 µm. In addition, the semiconductor light emitting structure 110 may have, for example, a large aspect ratio of 5 or more. In general, the diameter D of the semiconductor light emitting structure 110 may be selected to be about 600 nm, and the height H may be selected to be about 5 µm. In this case, the aspect ratio of the semiconductor light emitting structure 110 is slightly greater than 8.

When the semiconductor light emitting structure 110 having a large aspect ratio is manufactured with such a small size, the surface to volume ratio increases and surface defects of the light emitting layer 104 increase. In other words, surface defects due to dangling bonds occur on the outer surface of the light emitting layer 104, and as the surface to volume ratio increases, the dangling bonds also increase, resulting in an increase in the number of surface defects. These surface defects interfere with the flow of current and become a factor of lowering the luminous efficiency of the light emitting layer 104.

According to an embodiment, the passivation film 111 surrounding the sidewall of the semiconductor light emitting structure 110 may include an insulating crystalline material having the substantially same crystal structure as that of the semiconductor light emitting structure 110. In particular, the passivation film 111 may have a lattice matching epitaxy relationship or a domain matching epitaxy relationship with the semiconductor light emitting structure 110. The lattice matching epitaxy relationship means a relationship in which the lattice constant of the passivation film 111 is substantially equal to the lattice constant of the semiconductor light emitting structure 110. In addition, the domain matching epitaxy relationship means a relationship in which the lattice constant of the passivation film 111 is substantially equal to an integer multiple of the lattice constant of the semiconductor light emitting structure 110 or a relationship in which the lattice constant of the semiconductor light emitting structure 110 is substantially equal to an integer multiple of the lattice constant of the passivation film 111. The lattice constant of the passivation film 111 does not have to perfectly match the lattice constant of the semiconductor light emitting structure 110 or an integer multiple thereof, and may be within a predetermined similar range. For example, the difference between the lattice constant of the passivation film 111 and the lattice constant of the semiconductor light emitting structure 110 may be within ±30% of the lattice constant of the semiconductor light emitting structure 110. In one or more embodiments, a difference between the lattice constant of the passivation film 111 and an integer multiple of the lattice constant of the semiconductor light emitting structure 110 may be within ±30% of an integer multiple of the lattice constant of the semiconductor light emitting structure 110 or a difference between the lattice constant of the semiconductor light emitting structure 110 and an integer multiple of the lattice constant of the passivation film 111 may be within ±30% of the lattice constant of the semiconductor light emitting structure 110.

In this case, because atoms located on the outer surface of the semiconductor light emitting structure 110 may mostly bond to the atoms of the passivation film 111, dangling bonds on the outer surface of the semiconductor light emitting structure 110 are reduced, and thus surface defects are also reduced. Accordingly, a current may flow relatively uniformly in the entire area of the light emitting layer 104 and light emission may occur relatively uniformly in the entire area of the light emitting layer 104. Accordingly, the luminous efficiency of the nanorod light emitting device 100 may be increased.

Figure 2:
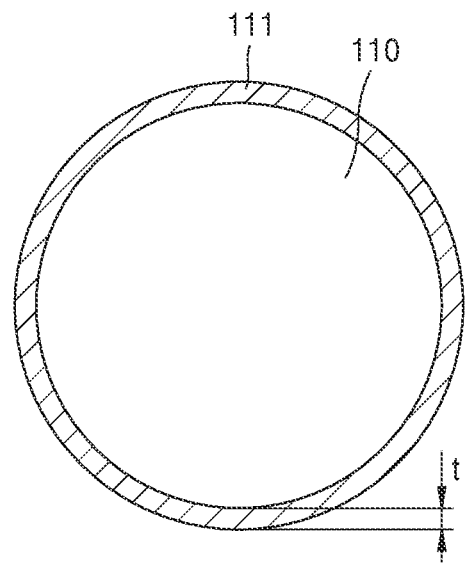
FIG. 2 is a plan view of the nanorod light emitting device shown in FIG. 1.

FIG. 2 is a plan view of the nanorod light emitting device 100 shown in FIG. 1. The passivation film 111 may serve to protect the semiconductor light emitting structure 110 from external physical and chemical impact and also to insulate the semiconductor light emitting structure 110 to prevent leakage of current in addition to the role of reducing surface defects on the outer surface of the semiconductor light emitting structure 110. For this, as shown in FIG. 2, the passivation film 111 may be disposed to completely surround the sidewall of the semiconductor light emitting structure 110. Therefore, the passivation film 111 may have a ring shape in a plan view as shown in FIG. 2, and may have a cylindrical shape as a whole. Although the semiconductor light emitting structure 110 is illustrated as having a circular shape in FIG. 2, the disclosure is not necessarily limited thereto. The thickness t of the passivation film 111 according to the diameter direction of the nanorod light emitting device 100, that is, the distance between the inner sidewall and the outer sidewall of the passivation film 111, may be in the range of about 5 nm to about 20 nm.

In addition, in order that electrons and holes are confined in the semiconductor light emitting structure 110, particularly in the light emitting layer 104, so that light may be easily generated from the light emitting layer 104, the energy bandgap of the passivation film 111 may be greater than the energy bandgap of the semiconductor light emitting structure 110, in particular, the energy bandgap of the light emitting layer 104. A material of the passivation film 111 that satisfies the above conditions may include at least one material of ZrO, SrO, MgO, BaO, $CeO_2$, $Gd_2O_3$, CaO, $HfO_2$, $TiO_2$, $AlO_x$, BaN, SiN, TiN, CeN, AlN, ZnSe, ZnS, AlGaN, and $Al_xGa_{1-x}As$ (x≥0.9), for example.

FIGS. 3A to 3E are cross-sectional views illustrating an example method of manufacturing the nanorod light emitting device shown in FIG. 1. Hereinafter, a method of manufacturing the nanorod light emitting device 100 according to an embodiment will be described with reference to FIGS. 3A to 3E.

Figure 3A:
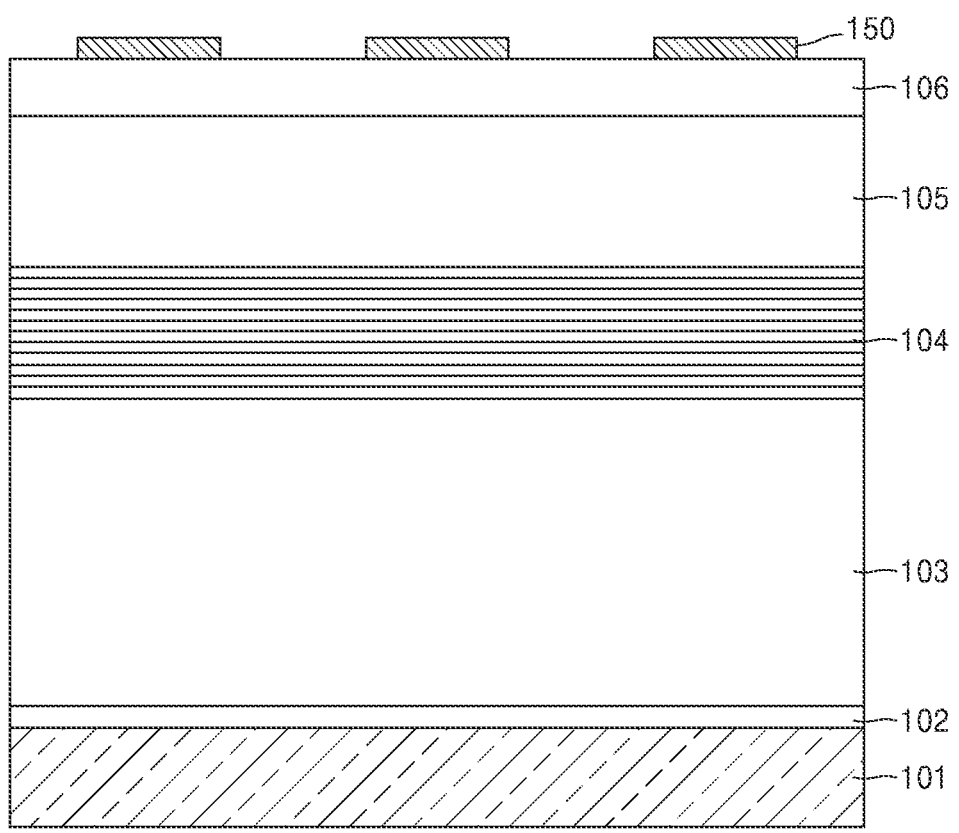
FIGS. 3A to 3E are cross-sectional views illustrating an example of a method of manufacturing the nanorod light emitting device shown in FIG. 1.

Referring first to FIG. 3A, a buffer layer 102, a first semiconductor layer 103, a light emitting layer 104, a second semiconductor layer 105, and a transparent electrode 106 are sequentially grown on the substrate 101. The buffer layer 102 is disposed over a large area of the upper surface of the substrate 101, the first semiconductor layer 103 is grown on the entire upper surface of the buffer layer 102, and the light emitting layer 104 is grown on the entire upper surface of the first semiconductor layer 103. Further, the second semiconductor layer 105 and the transparent electrode 106 may each be grown to be disposed over the entire upper surface of the respective underlying layers.

The substrate 101 and the buffer layer 102 may include, for example, sapphire or GaAs. The substrate 101 and the buffer layer 102 may be doped with the same conductivity type impurity as that of the first semiconductor layer 103 thereon. For example, when the first semiconductor layer 103 is n-type doped, the substrate 101 and the buffer layer 102 may also be n-type doped. The substrate 101 may be doped at a lower concentration than that of the buffer layer 102. A contact layer for ohmic contact may be further disposed between the buffer layer 102 and the first semiconductor layer 103. The contact layer disposed between the buffer layer 102 and the first semiconductor layer 103 may also be doped with the same conductivity type impurity as that of the first semiconductor layer 103, and may be doped with a concentration higher than the doping concentration of the buffer layer 102 and the first semiconductor layer 103. In addition, a contact layer may be further disposed between the second semiconductor layer 105 and the transparent electrode 106. For example, the contact layer may be made of GaInP or GaAs, or may include both GaInP and GaAs.

When the nanorod light emitting device 100 is a light emitting device that generates red light, the first semiconductor layer 103 may be formed of, for example, n-AlGaInP, and the second semiconductor layer 105 may be formed of p-AlGaInP. Accordingly, the first semiconductor layer 103 is a single layer made of a semiconductor material of a single composition, and the second semiconductor layer 105 is also a single layer made of a semiconductor material having the same composition as that of the first semiconductor layer 103. However, the first semiconductor layer 103 and the second semiconductor layer 105 are doped in opposite types. For example, the first semiconductor layer 103 may be doped with Si and the second semiconductor layer 105 may be doped with Zn. According to the emission color of the nanorod light emitting device 100, the material of the first semiconductor layer 103 and the second semiconductor layer 105 may include other semiconductor materials such as, for example, InGaN, AlGaInN, and the like in addition to AlGaInP.

The light emitting layer 104 may be made of, for example, AlGaInP when red light is emitted. AlGaInP of the light emitting layer 104 is not doped. The light emitting layer 104 includes a barrier and a quantum well, and for this, the content of Al in AlGaInP may vary. For example, the barrier contains more Al than the amount of Al in the quantum wells. In addition, the first and second semiconductor layers 103 and 105 have the highest Al content, and next, there is a large amount of Al in the barrier in the light emitting layer 104, and the content of Al is the lowest in the quantum well in the light emitting layer 104. Then, in the conduction band, the energy levels of the first and second semiconductor layers 103 and 105 are the highest, the energy level of the barrier in the light emitting layer 104 is next highest, and the energy level of the quantum well in the light emitting layer 104 is the lowest. Even when a semiconductor material other than AlGaInP is used, the light emitting layer 104 may be formed to have a barrier and quantum well by controlling the composition of the material.

After the transparent electrode 106 is formed, the hard mask 150 having a plurality of openings arranged at regular intervals is formed on the transparent electrode 106. For example, after the material of the hard mask 150 is entirely formed on the upper surface of the transparent electrode 106, in order to have a plurality of openings arranged at regular intervals using a lithographic method, the hard mask 150 may be formed by patterning the material of the hard mask 150. The hard mask 150 may be formed of, for example, a single layer of $SiO_2$ or a double layer of $SiO_2$/Al. Although not specified in the cross-sectional view of FIG. 3A, the hard mask 150 may have a plurality of two-dimensionally arranged openings when viewed from the top.

Figure 3B:
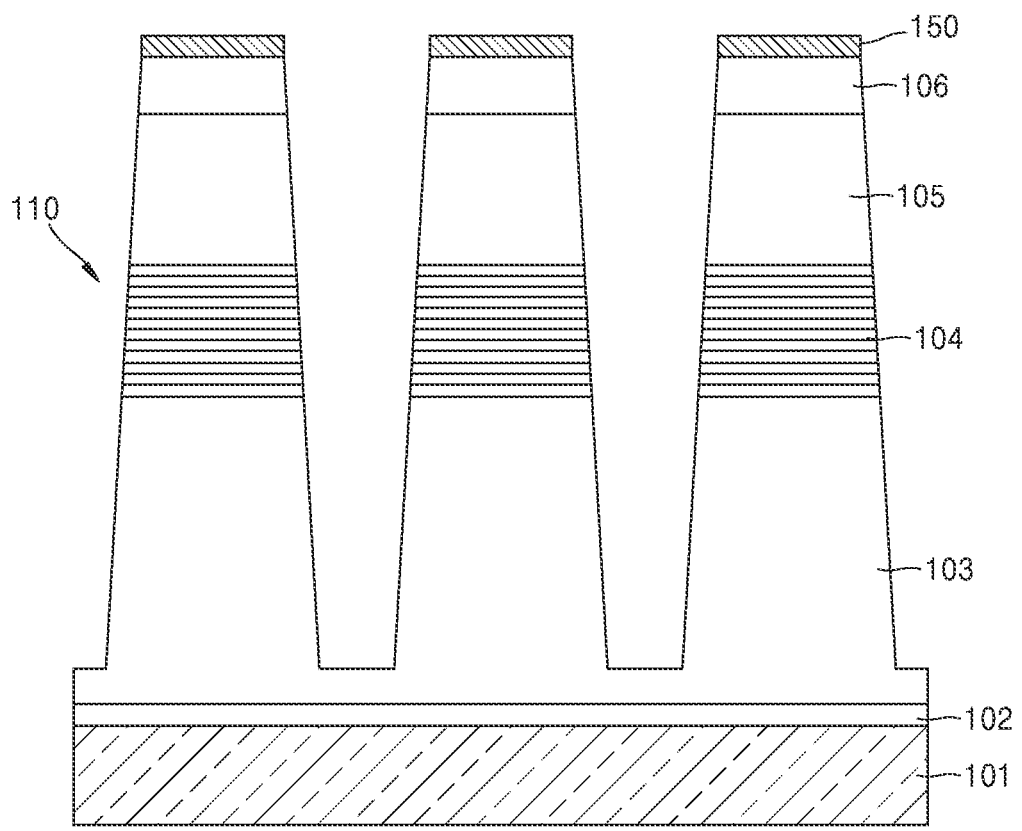

Referring to FIG. 3B, areas not covered with the hard mask 150 may be removed by etching using a dry etching method. For example, by sequentially etching and removing the transparent electrode 106, the second semiconductor layer 105, the light emitting layer 104, and the first semiconductor layer 103 under the openings in the hard mask 150, the transparent electrode 106, the second semiconductor layer 105, the light emitting layer 104, and the first semiconductor layer 103 may be patterned in the form of a plurality of nanorods. Then, as shown in FIG. 3B, a plurality of semiconductor light emitting structures 110 having a nanorod shape each including the transparent electrode 106, the second semiconductor layer 105, the light emitting layer 104, and the first semiconductor layer 103 may be formed simultaneously on the substrate 101 and the buffer layer 102. Although it is illustrated in FIG. 3B that the lower portion of the first semiconductor layer 103 partially remains, the disclosure is not limited thereto, and etching may be performed until the buffer layer 102 is exposed. Then, even the lower portion of the first semiconductor layer 103 may be completely etched and the buffer layer 102 may instead remain partially.

Figure 3C:
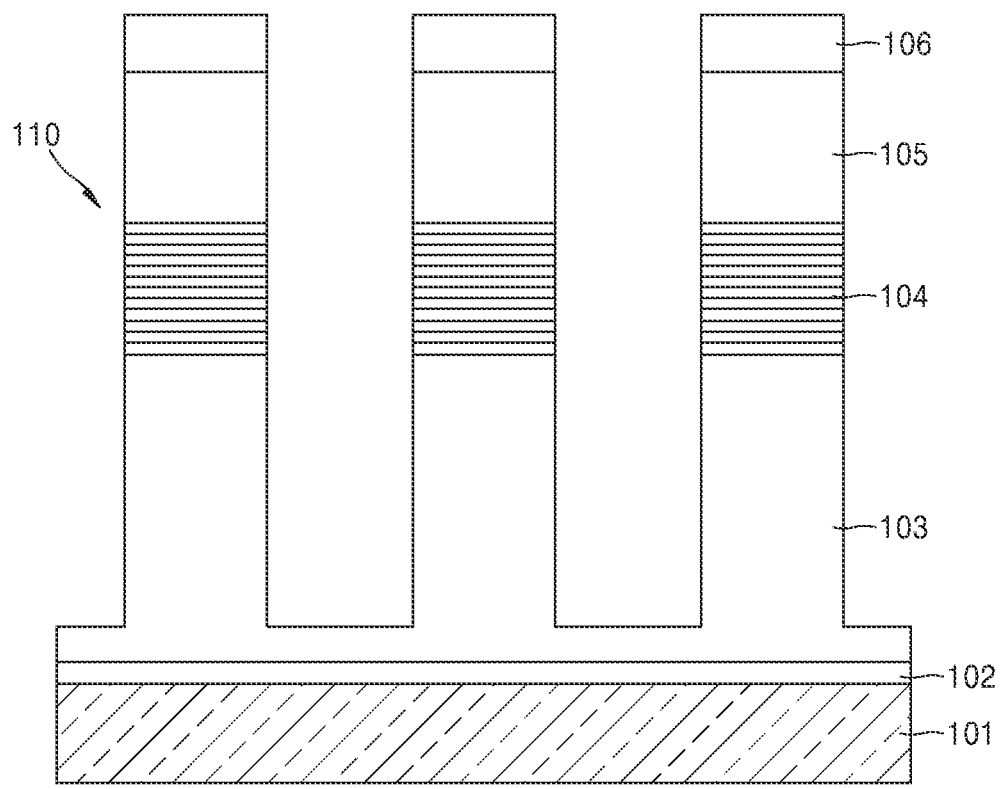

The semiconductor light emitting structures 110 formed in FIG. 3B may have a shape in which a diameter gradually decreases along a height direction from the first semiconductor layer 103 to the transparent electrode 106. Referring to FIG. 3C, the diameter of the semiconductor light emitting structures 110 may be made uniform along the height direction through a wet process using, for example, a KOH solution. In this process, the hard mask 150 may also be removed.

Figure 3D:
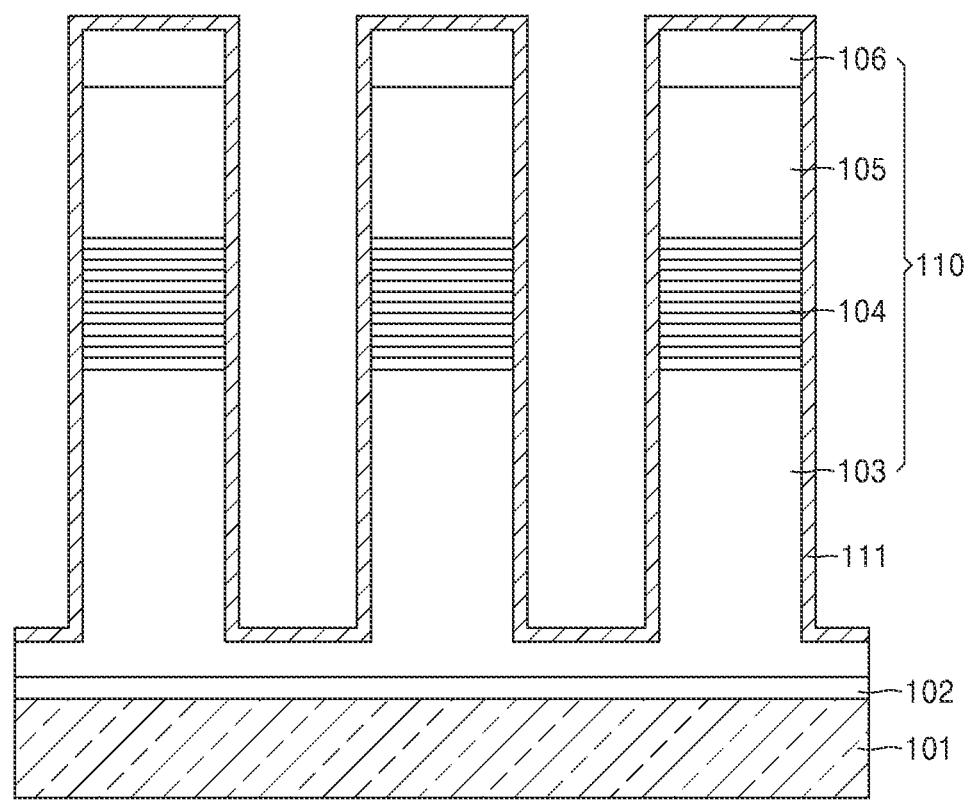

Referring to FIG. 3D, a passivation film 111 may be formed with a uniform thickness on the surface of the semiconductor light emitting structure 110. In order to form the passivation film 111, for example, after depositing a passivation film material for several cycles using an atomic layer deposition (ALD) method, the process of heating and crystallizing the deposited passivation film material may be repeated.

Figure 4:
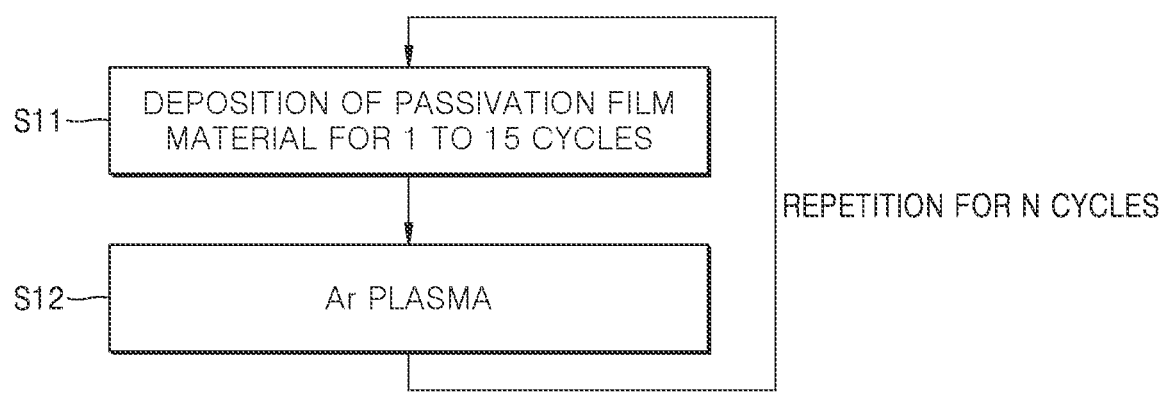
FIG. 4 is a flowchart showing an example of a process of forming a passivation film.

FIG. 4 is a flowchart showing an example process of forming the passivation film 111. Referring to FIG. 4, the passivation film material may be repeatedly deposited within 1 to 15 cycles using the ALD method (S11). Depending on the passivation film material, the thickness of the deposited passivation film material may increase by about 0.5 nm per deposition cycle. Then, the deposited passivation film material may be crystallized by heating (S12). For example, the deposited passivation film material may be crystallized using an argon (Ar) plasma method. And, until the thickness of the crystallized passivation film 111 reaches the target thickness, the process of depositing the passivation film material (S11) and the process of crystallizing the deposited passivation film material (S12) may be repeated for 1 to 10 cycles.

According to this method, it is possible to form the crystallized passivation film 111 surrounding the surface of the semiconductor light emitting structure 110 while minimizing damage to the semiconductor light emitting structure 110. In the process of depositing the passivation film material (S11), the number of deposition cycles may be determined in consideration of the thickness of a passivation film material that may be crystallized by an argon (Ar) plasma method without damaging the semiconductor light emitting structure 110. In addition, the number of times of repeating the process S11 of depositing the passivation film material and the process S12 of crystallizing the deposited passivation film material may be determined according to the target thickness of the crystallized passivation film 111.

Figure 3E:
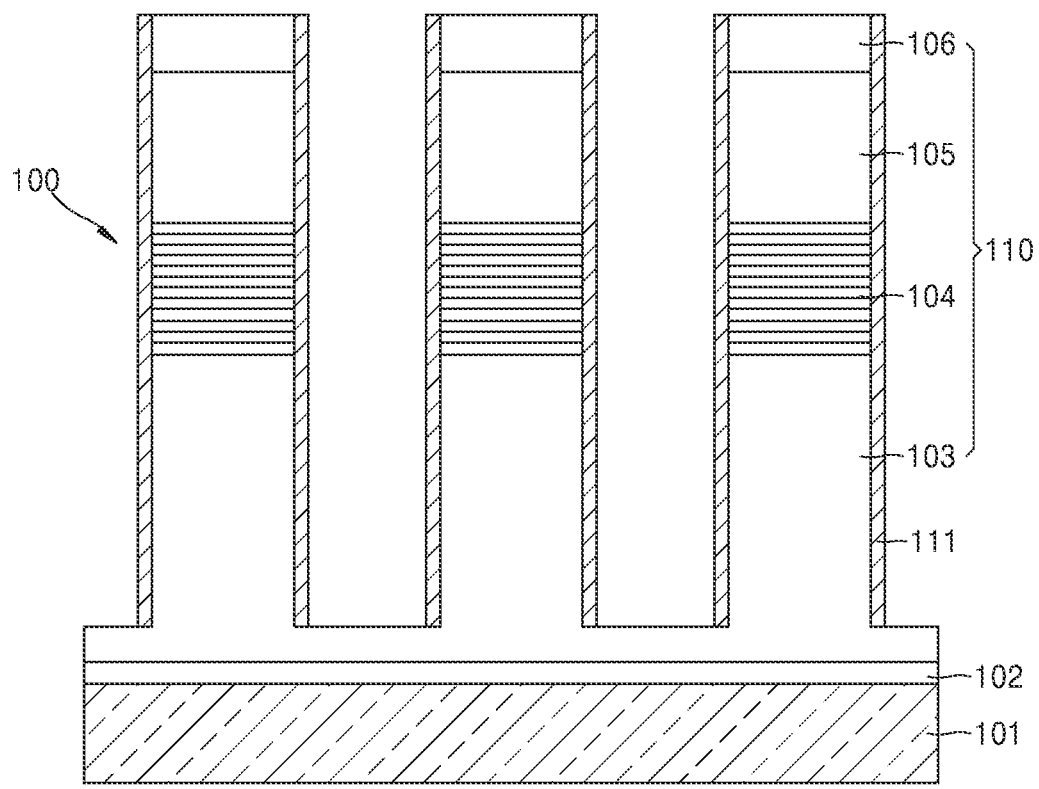

Finally, referring to FIG. 3E, the passivation film 111 between the adjacent semiconductor light emitting structures 110 and the passivation film 111 on the upper surface of the semiconductor light emitting structure 110 may be removed. Then, only the passivation film 111 surrounding each sidewall of the plurality of semiconductor light emitting structures 110 may remain. In this way, a plurality of nanorod light emitting devices 100 may be simultaneously formed on the substrate 101 and the buffer layer 102. Thereafter, the plurality of nanorod light emitting devices 100 may be individually separated by removing the buffer layer 102. In one or more embodiments, each nanorod light emitting device 100 may be used by cutting the substrate 101 and the buffer layer 102 in the longitudinal direction in a state in which the substrate 101 and the buffer layer 102 are attached together to each nanorod light emitting device 100. In one or more embodiments, the substrate 101 and the buffer layer 102 are cut in the vertical direction so that two or more nanorod light emitting devices 100 remain, and thus, it is also possible to use two or more nanorod light emitting devices 100 together.

Figure 5:
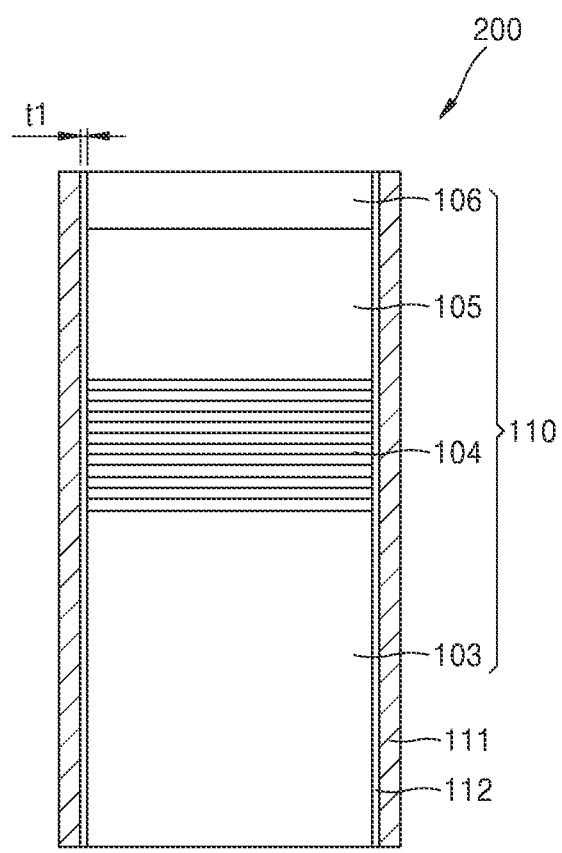
FIG. 5 is a cross-sectional view showing a schematic configuration of a nanorod light emitting device according to an embodiment.

FIG. 5 is a cross-sectional view showing a schematic configuration of a nanorod light emitting device according to an embodiment. Referring to FIG. 5, the nanorod light emitting device 200 may further include a protective film 112 disposed between the semiconductor light emitting structure 110 and the passivation film 111. The remaining structure of the nanorod light emitting device 200 may be the same as that of the nanorod light emitting device 100 shown in FIG. 1.

The protective film 112 may serve to protect the semiconductor light emitting structure 110 from being damaged by plasma in the process of forming the crystallized passivation film 111. For this, the protective film 112 may be formed to directly surround the sidewall of the semiconductor light emitting structure 110, and the passivation film 111 may be formed to surround the sidewall of the protective film 112. Therefore, the protective film 112 and the passivation film 111 are arranged in the form of concentric circles. Because the protective film 112 prevents damage to the semiconductor light emitting structure 110, it is not necessary for the protective film 112 to have a large thickness. The thickness of the protective film 112 may be less than the thickness of the passivation film 111. For example, the thickness t1 of the protective film 112, that is, the distance between the inner sidewall and the outer sidewall of the protective film 112, may be in the range of about 0.5 nm to about 5 nm.

Like the passivation film 111, the protective film 112 may also include an insulating crystalline material having the substantially same crystal structure as that of the semiconductor light emitting structure 110. In addition, the protective film 112 may also have a lattice matching epitaxy relationship or a domain matching epitaxy relationship with the semiconductor light emitting structure 110. For this, the material of the protective film 112 may be selected from among the example materials of the passivation film 111 set forth above. Accordingly, the energy bandgap of the protective film 112 may be greater than the energy bandgap of the semiconductor light emitting structure 110. In addition, the protective film 112 and the passivation film 111 may be made of the same material or different materials. When the protective film 112 and the passivation film 111 are made of different materials, the energy bandgap of the passivation film 111 may be selected to be greater than the energy bandgap of the protective film 112. However, when the protective film 112 and the passivation film 111 are made of the same material, the energy bandgap of the passivation film 111 is the same as that of the protective film 112.

Figure 6:
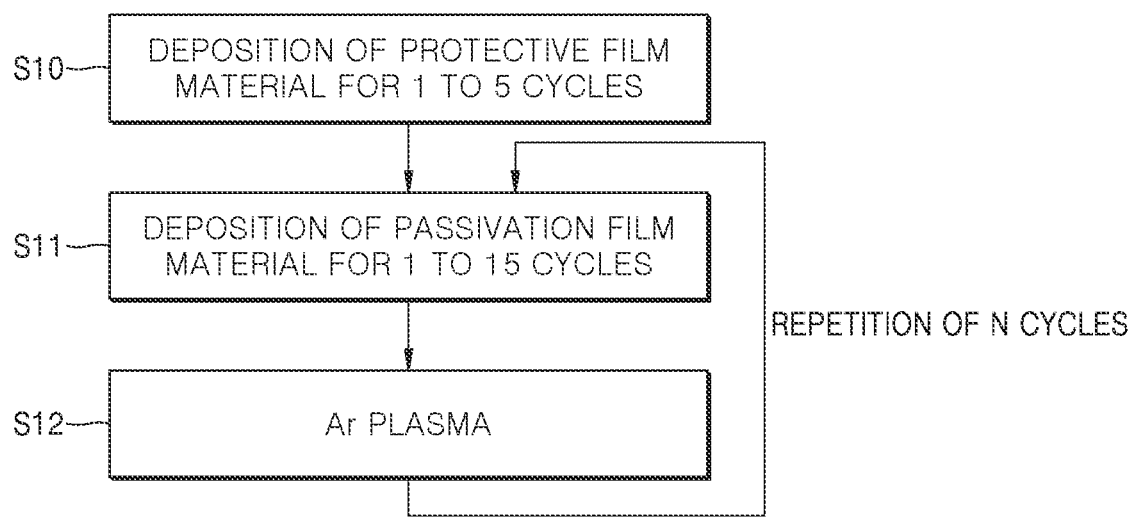
FIG. 6 is a flowchart showing an example of a process of forming a protective film and a passivation film shown in FIG. 5.

FIG. 6 is a flowchart showing an example process of forming the protective film and the passivation film shown in FIG. 5. Referring to FIG. 6, the protective film material may be repeatedly deposited for 1 to 5 cycles using the ALD method (S10). Thereafter, the passivation film material may be repeatedly deposited for 1 to 15 cycles using the ALD method (S11). In addition, the deposited protective film material and passivation film material may be crystallized using, for example, an argon (Ar) plasma method (S12). At this time, the protective film material may be crystallized to form the protective film 112. Then, until the thickness of the crystallized passivation film 111 reaches the target thickness, the process of depositing the passivation film material (S11) and the process of crystallizing the deposited passivation film material (S12) may be repeated for 1 to 10 cycles. Therefore, the protective film 112 may be formed in the first crystallization process (S12). If necessary, the number of deposition cycles in the passivation film material deposition process S11 of an initial stage may be less than the number of deposition cycles in the passivation film material deposition process S11 of subsequent stages.

Figure 7:
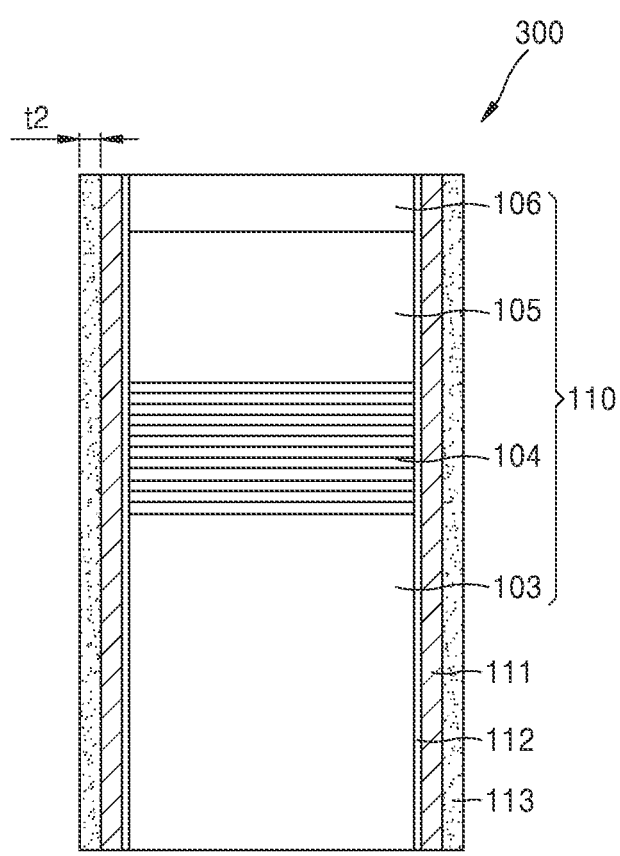
FIG. 7 is a cross-sectional view showing a schematic configuration of a nanorod light emitting device according to an embodiment.

FIG. 7 is a cross-sectional view showing a schematic configuration of a nanorod light emitting device according to an embodiment. Referring to FIG. 7, a nanorod light emitting device 300 may further include an insulating film 113 surrounding a sidewall of a passivation film 111. The remaining structure of the nanorod light emitting device 300 may be the same as that of the nanorod light emitting device 200 shown in FIG. 5. Since the protective film 112, the passivation film 111, and the insulating film 113 are sequentially disposed on the sidewall of the semiconductor light emitting structure 110, the protective film 112, the passivation film 111, and the insulating film 113 are arranged in the form of concentric cylinders or circles in cross section. Although the nanorod light emitting device 300 is illustrated as including the protective film 112 in FIG. 7, the protective film 112 may be omitted. In this case, the nanorod light emitting device 300 may include a passivation film 111 and an insulating film 113 sequentially arranged on the sidewall of the semiconductor light emitting structure 110.

The insulating film 113 may insulate the nanorod light emitting device 300 to more reliably prevent leakage current. The insulating film 113 does not need to be crystalline and may be made of an amorphous material having insulating properties (e.g., an amorphous insulating material). For example, the insulating film 113 may include at least one amorphous material selected from among the materials of the passivation film 111 exemplified above. The thickness t2 of the insulating film 113, that is, the distance between the inner sidewall and the outer sidewall of the insulating film 113, may be larger than the thickness of the protective film 112 and the passivation film 111. For example, the thickness t2 of the insulating film 113 may be in a range of about 40 nm to about 70 nm.

Figure 8:
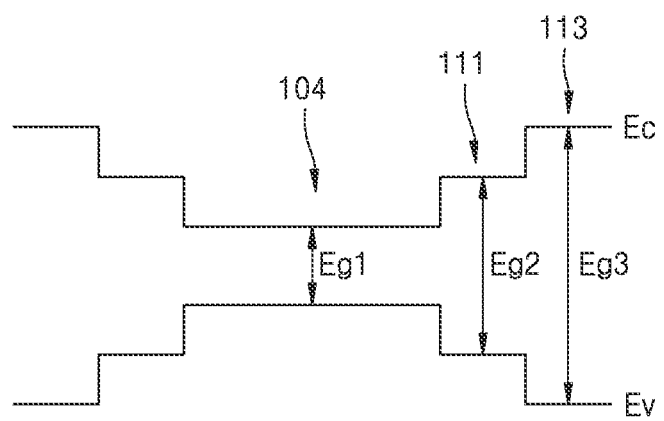
FIG. 8 shows an example of an energy band diagram for a passivation film and an insulating film shown in FIG. 7.

In order to confine current to the inside of the insulating film 113, the energy bandgap of the insulating film 113 may be greater than that of the passivation film 111. FIG. 8 shows an example energy band diagram for the passivation film 111 and the insulating film 113 shown in FIG. 7. Referring to FIG. 8, the energy bandgap Eg2 of the passivation film 111 may be greater than the energy bandgap Eg1 of the semiconductor light emitting structure 110, in particular, the light emitting layer 104, and the energy bandgap Eg3 of the insulating film 113 may be greater than the energy bandgap of the passivation film 111.

Figure 9:
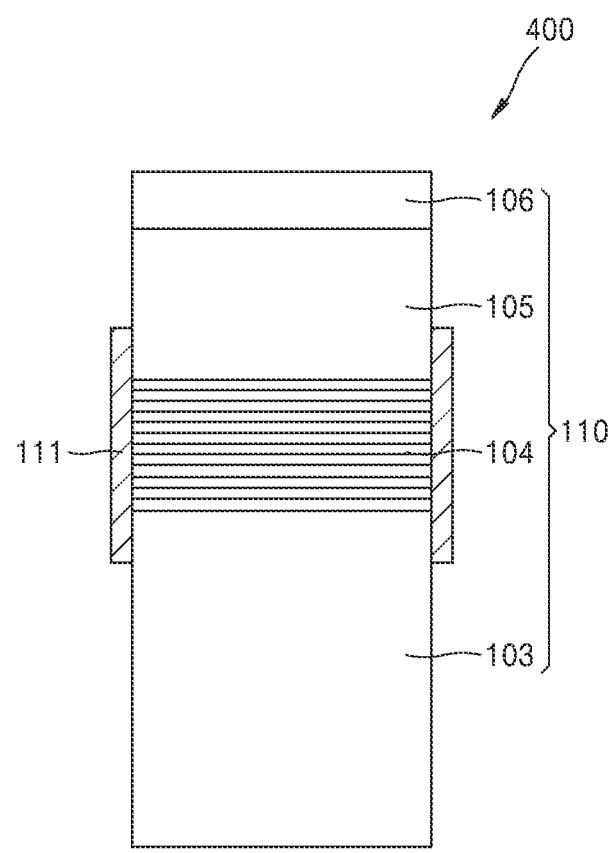
FIG. 9 is a cross-sectional view showing a schematic configuration of a nanorod light emitting device according to an embodiment.

FIG. 9 is a cross-sectional view showing a schematic configuration of a nanorod light emitting device according to an embodiment. So far, the passivation film 111 has been shown to surround all sidewalls of the first semiconductor layer 103, the light emitting layer 104, and the second semiconductor layer 105, but the disclosure is not limited thereto. Referring to FIG. 9, the nanorod light emitting device 400 may include a passivation film 111 surrounding only some sidewalls of the semiconductor light emitting structure 110. The passivation film 111 may be formed to surround only the light emitting layer 104 or at least a part of sidewalls of the semiconductor light emitting structure 110 including the light emitting layer 104.

Figure 10:
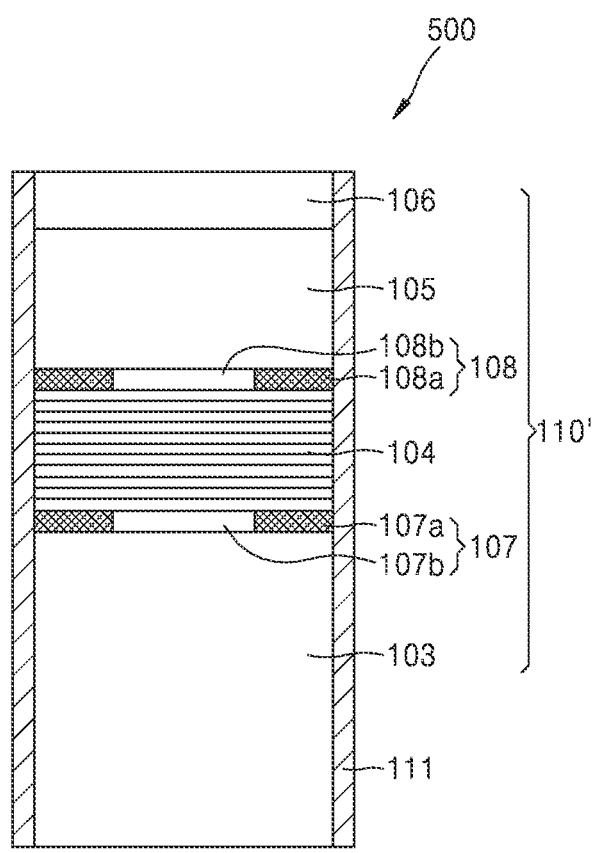
FIG. 10 is a cross-sectional view showing a schematic configuration of a nanorod light emitting device according to an embodiment.

FIG. 10 is a cross-sectional view showing a schematic configuration of a nanorod light emitting device according to an embodiment. Referring to FIG. 10, the nanorod light emitting device 500 may include a semiconductor light emitting structure 110' configured to concentrate current into a central portion of the light emitting layer 104 in a radial direction of the nanorod light emitting device, and a passivation film 111 surrounding a sidewall of the semiconductor light emitting structure 110'.

The semiconductor light emitting structure 110' may include a first semiconductor layer 103, a light emitting layer 104 disposed on the first semiconductor layer 103, a second semiconductor layer 105 disposed on the light emitting layer 104, a transparent electrode 106 disposed on the second semiconductor layer 105, a first current passage layer 107 disposed between the first semiconductor layer 103 and the light emitting layer 104, and a second current passage layer 108 disposed between the light emitting layer 104 and the second semiconductor layer 105. The first current passage layer 107 and the second current passage layer 108 respectively disposed on the lower surface and the upper surface of the light emitting layer 104 concentrate the current to the central portion of the light emitting layer 104 in the radial direction to further improve the luminous efficiency of the light emitting layer 104.

For this, the first current passage layer 107 may include a first current blocking layer 107a disposed between the edge of the lower surface of the light emitting layer 104 and the edge of the upper surface of the first semiconductor layer 103, and a first conductive layer 107b disposed between the central portion of the lower surface of the light emitting layer 104 and the central portion of the upper surface of the first semiconductor layer 103. The first current blocking layer 107a has a ring shape surrounding the sidewall of the first conductive layer 107b in the same plane as the first conductive layer 107b. In addition, the second current passage layer 108 may include a second current blocking layer 108a disposed between an edge of an upper surface of the light emitting layer 104 and an edge of a lower surface of the second semiconductor layer 105 and a second conductive layer 108b disposed between a central portion of an upper surface of the light emitting layer 104 and a central portion of a lower surface of the second semiconductor layer 105. The second current blocking layer 108a has a ring shape surrounding the sidewall of the second conductive layer 108b in the same plane as the second conductive layer 108b.

The height of the first current blocking layer 107a and the height of the first conductive layer 107b in an axial direction of the nanorod light emitting device may be the same, and the height of the second current blocking layer 108a and the height of the second conductive layer 108b may be the same. For example, the height of the first current blocking layer 107a and the second current blocking layer 108a may range from about 5 nm to about 200 nm. Also, the outer diameter of the first current blocking layer 107a and the second current blocking layer 108a may be in the range of about 0.05 μm to about 2 μm, which is the same as the outer diameter of the nanorod light emitting device 500. The diameters of the first conductive layer 107b and the second conductive layer 108b may be about 0.01 μm or more, and may be smaller than the outer diameters of the first current blocking layer 107a and the second current blocking layer 108a.

Figure 11:
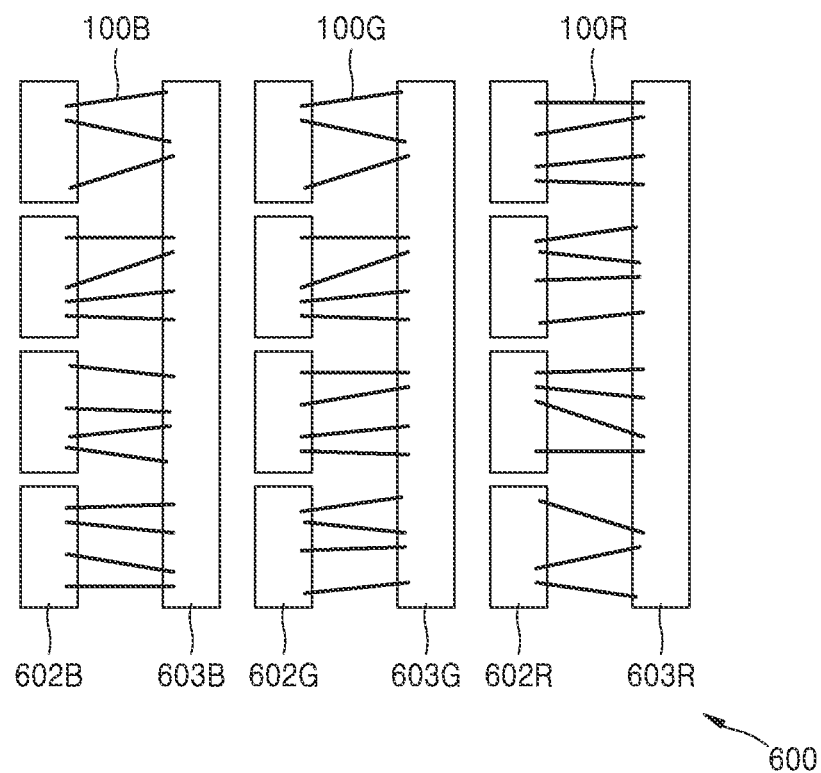
FIG. 11 is a conceptual diagram schematically showing a configuration of a display apparatus according to an embodiment using a nanorod light emitting device.

The above-described nanorod light emitting devices 100, 200, 300, 400, and 500 may have various applications. In particular, the nanorod light emitting devices 100, 200, 300, 400, and 500 may be used as light emitting elements of pixels of a next-generation display apparatus. For example, FIG. 11 is a conceptual diagram schematically showing a configuration of a display apparatus according to an embodiment using a nanorod light emitting device. Referring to FIG. 11, the display apparatus 600 may include a plurality of first pixel electrodes 602B, a first common electrode 603B (e.g., at least one common electrode) corresponding to the plurality of first pixel electrodes 602B, a plurality of second pixel electrodes 602G, a second common electrode 603G corresponding to the plurality of second pixel electrodes 602G, a plurality of third pixel electrodes 602R, a third common electrode 603R corresponding to the plurality of third pixel electrodes 602R, a plurality of first nanorod light emitting devices 1006 connected between each of the first pixel electrodes 602B and the first common electrode 603B, a plurality of second nanorod light emitting devices 100G connected between each second pixel electrode 602G and the second common electrode 603G, and a plurality of third nanorod light emitting devices 100R connected between each third pixel electrode 602R and the third common electrode 603R.

For example, the first nanorod light emitting device 100B may be configured to emit blue light, the second nanorod light emitting device 100G may be configured to emit green light, and the third nanorod light emitting device 100R may be configured to emit red light. In addition, one first pixel electrode 602B may constitute one blue sub-pixel together with the first common electrode 603B, one second pixel electrode 602G may constitute one green sub-pixel together with the second common electrode 603G, and one third pixel electrode 602R may constitute one red sub-pixel together with the third common electrode 603R.

The nanorod light emitting devices 100, 200, 300, 400, and 500 according to embodiments may be applied to display apparatuses of various sizes and uses without limitation. For example, FIGS. 12 to 17 show examples of various devices including a display apparatus to which nanorod light emitting devices according to an embodiment are applied.

Figure 12:
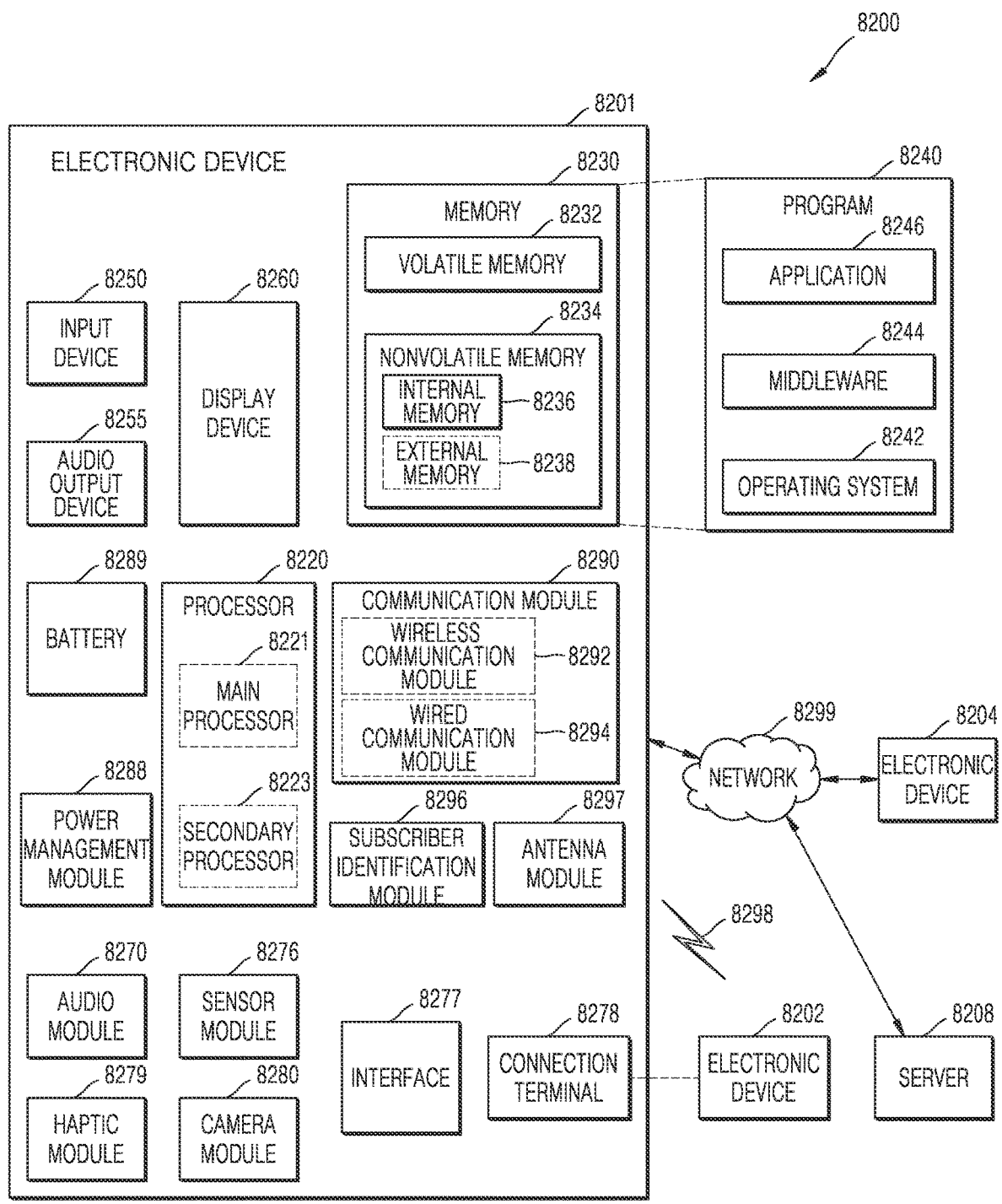
FIG. 12 is a schematic block diagram of an electronic device according to an embodiment.

First, FIG. 12 is a schematic block diagram of an electronic device according to an example embodiment. Referring to FIG. 12, an electronic device 8201 may be provided in a network environment 8200. In the network environment 8200, the electronic device 8201 may communicate with another electronic device 8202 through a first network 8298 (such as a short-range wireless communication network, and the like), or communicate with another electronic device 8204 and/or a server 8208 through a second network 8299 (such as a remote wireless communication network). The electronic device 8201 may communicate with the electronic device 8204 through the server 8208. The electronic device 8201 may include a processor 8220, a memory 8230, an input device 8250, an audio output device 8255, a display device 8260, an audio module 8270, a sensor module 8276, and an interface 8277, a haptic module 8279, a camera module 8280, a power management module 8288, a battery 8289, a communication module 8290, a subscriber identification module 8296, and/or an antenna module 8297. In the electronic device 8201, some of these components may be omitted or other components may be added. Some of these components may be implemented as one integrated circuit. For example, the sensor module 8276 (fingerprint sensor, iris sensor, illuminance sensor, etc.) may be implemented by being embedded in the display device 8260 (display, etc.).

The processor 8220 may execute software (the program 8240, etc.) to control one or a plurality of other components (such as hardware, software components, etc.) of the electronic device 8201 connected to the processor 8220, and perform various data processing or operations. As part of data processing or operation, the processor 8220 may load commands and/or data received from other components (the sensor module 8276, the communication module 8290, etc.) into the volatile memory 8232, process commands and/or data stored in the volatile memory 8232, and store result data in the nonvolatile memory 8234. The nonvolatile memory 8234 may include an internal memory 8236 mounted in the electronic device 8201 and a removable external memory 8238. The processor 8220 may include a main processor 8221 (such as a central processing unit, an application processor, etc.) and a secondary processor 8223 (such as a graphics processing unit, an image signal processor, a sensor hub processor, a communication processor, etc.) that may be operated independently or together. The secondary processor 8223 may use less power than the main processor 8221 and may perform specialized functions.

The secondary processor 8223 may control functions and/or states related to some of the components of the electronic device 8202 (such as the display device 8260, the sensor module 8276, the communication module 8290, etc.) instead of the main processor 8221 while the main processor 8221 is in an inactive state (sleep state), or with the main processor 8221 while the main processor 8221 is in an active state (application execution state). The secondary processor 8223 (such as an image signal processor, a communication processor, etc.) may be implemented as part of other functionally related components (such as the camera module 8280, the communication module 8290, etc.).

The memory 8230 may store various data required by components of the electronic device 8201 (such as the processor 8220, the sensor module 8276, etc.). The data may include, for example, software (such as the program 8240, etc.) and input data and/or output data for commands related thereto. The memory 8230 may include a volatile memory 8232 and/or a nonvolatile memory 8234.

The program 8240 may be stored as software in the memory 8230 and may include an operating system 8242, a middleware 8244, and/or an application 8246.

The input device 8250 may receive commands and/or data to be used for components (such as the processor 8220, etc.) of the electronic device 8201 from outside (a user) of the electronic device 8201. The input device 8250 may include a remote controller, a microphone, a mouse, a keyboard, and/or a digital pen (such as a stylus pen).

The audio output device 8255 may output an audio signal to the outside of the electronic device 8201. The audio output device 8255 may include a speaker and/or a receiver. The speaker may be used for general purposes such as multimedia playback or recording playback, and the receiver may be used to receive incoming calls. The receiver may be combined as a part of the speaker or may be implemented as an independent separate device.

The display device 8260 may visually provide information to the outside of the electronic device 8201. The display device 8260 may include a display, a hologram device, or a projector and a control circuit for controlling the device. The display device 8260 may include the above-described driving circuit, micro semiconductor light emitting device, side reflection structure, bottom reflection structure, and the like. The display device 8260 may include a touch circuit set to sense a touch, and/or a sensor circuit (such as a pressure sensor) set to measure the strength of a force generated by the touch.

The audio module 8270 may convert sound into an electrical signal, or conversely, may convert an electrical signal into sound. The audio module 8270 may acquire sound through the input device 8250 or output sound through speakers and/or headphones of the audio output device 8255, and/or another electronic device (such as the electronic device 8202) directly or wirelessly connected to electronic device 8201.

The sensor module 8276 may detect an operating state (such as power, temperature, and the like) of the electronic device 8201 or an external environmental state (such as a user state, and the like), and generate an electrical signal and/or data value corresponding to the detected state. The sensor module 8276 may include a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more specified protocols that may be used for the electronic device 8201 to connect directly or wirelessly with another electronic device (such as the electronic device 8202). The interface 8277 may include a High Definition Multimedia Interface (HDMI), a Universal Serial Bus (USB) interface, an SD card interface, and/or an audio interface.

The connection terminal 8278 may include a connector through which the electronic device 8201 may be physically connected to another electronic device (such as the electronic device 8202). The connection terminal 8278 may include an HDMI connector, a USB connector, an SD card connector, and/or an audio connector (such as a headphone connector).

The haptic module 8279 may convert an electrical signal into a mechanical stimulus (such as vibration, movement, etc.) or an electrical stimulus that a user may perceive through a tactile or motor sense. The haptic module 8279 may include a motor, a piezoelectric element, and/or an electrical stimulation device.

The camera module 8280 may capture a still image and a video. The camera module 8280 may include a lens assembly including one or more lenses, image sensors, image signal processors, and/or flashes. The lens assembly included in the camera module 8280 may collect light emitted from a subject that is a target of image capturing.

The power management module 8288 may manage power supplied to the electronic device 8201. The power management module 8288 may be implemented as a part of a Power Management Integrated Circuit (PMIC).

The battery 8289 may supply power to components of the electronic device 8201. The battery 8289 may include a non-rechargeable primary cell, a rechargeable secondary cell, and/or a fuel cell.

The communication module 8290 may support establishing a direct (wired) communication channel and/or a wireless communication channel, and performing communication through the established communication channel between the electronic device 8201 and other electronic devices (such as the electronic device 8202, the electronic device 8204, the server 8208, and the like). The communication module 8290 may include one or more communication processors that operate independently of the processor 8220 (such as an application processor) and support direct communication and/or wireless communication. The communication module 8290 may include a wireless communication module 8292 (such as a cellular communication module, a short-range wireless communication module, a Global Navigation Satellite System (GNSS) communication module, and the like) and/or a wired communication module 8294 (such as a local area network (LAN) communication module, a power line communication module, and the like). Among these communication modules, a corresponding communication module may communicate with other electronic devices through a first network 8298 (a short-range communication network such as Bluetooth, WiFi Direct, or Infrared Data Association (IrDA)) or a second network 8299 (a cellular network, the Internet, or a telecommunication network such as a computer network (such as LAN, WAN, and the like)). These various types of communication modules may be integrated into one component (such as a single chip, and the like), or may be implemented as a plurality of separate components (a plurality of chips). The wireless communication module 8292 may check and authenticate the electronic device 8201 in a communication network such as the first network 8298 and/or the second network 8299 using the subscriber information (such as international mobile subscriber identifier (IMSI), etc.) stored in the subscriber identification module 8296.

The antenna module 8297 may transmit signals and/or power to the outside (such as other electronic devices) or receive signals and/or power from the outside. The antenna may include a radiator made of a conductive pattern formed on a substrate (such as PCB, etc.). The antenna module 8297 may include one or a plurality of antennas. If multiple antennas are included, an antenna suitable for a communication method used in a communication network such as the first network 8298 and/or the second network 8299 may be selected from the plurality of antennas by the communication module 8290. Signals and/or power may be transmitted or received between the communication module 8290 and another electronic device through the selected antenna. In addition to the antenna, other components (such as RFIC) may be included as part of the antenna module 8297.

Some of the components are connected to each other and may exchange signals (such as commands, data, and the like) through communication method between peripheral devices (such as bus, General Purpose Input and Output (GPIO), Serial Peripheral Interface (SPI), Mobile Industry Processor Interface (MIPI), and the like).

The command or data may be transmitted or received between the electronic device 8201 and the external electronic device 8204 through the server 8208 connected to the second network 8299. The other electronic devices 8202 and 8204 may be the same or different types of devices as or from the electronic device 8201. All or some of the operations executed by the electronic device 8201 may be executed by one or more of the other electronic devices 8202, 8204, and 8208. For example, when the electronic device 8201 needs to perform a certain function or service, instead of executing the function or service itself, the electronic device 8201 may request one or more other electronic devices to perform the function or part or all of the service. One or more other electronic devices that receive the request may execute an additional function or service related to the request, and transmit a result of the execution to the electronic device 8201. For this, cloud computing, distributed computing, and/or client-server computing technology may be used.

Figure 13:
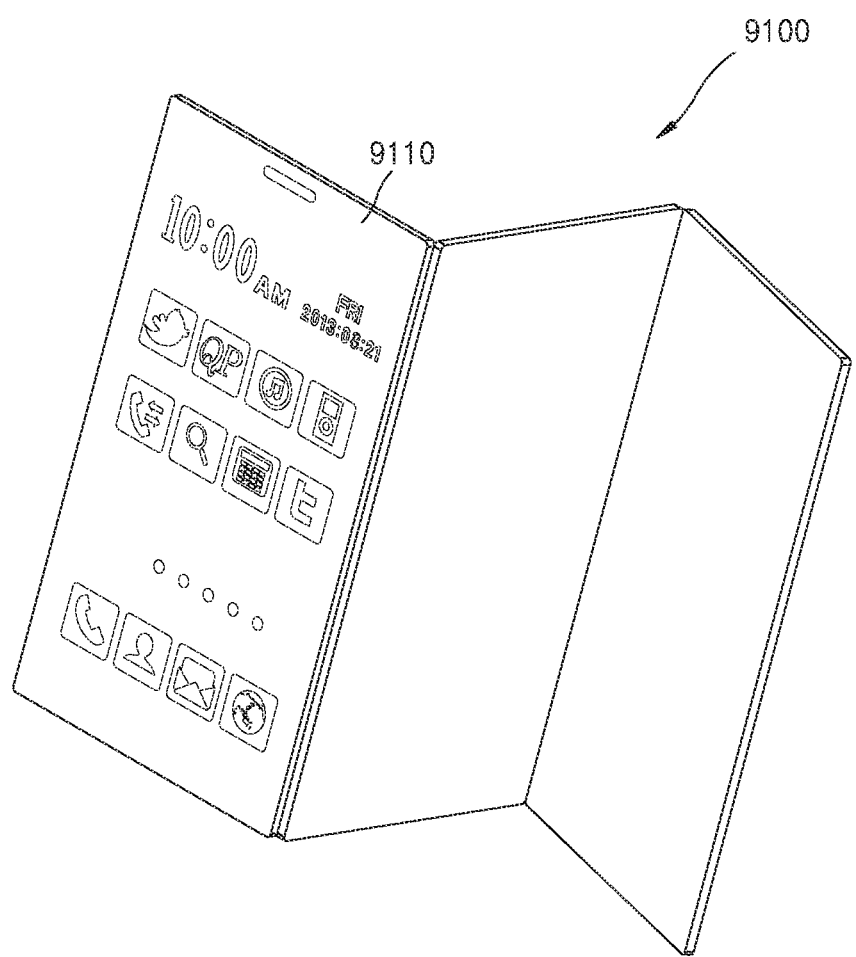
FIG. 13 illustrates an example of applying a display apparatus according to embodiments to a mobile device.

FIG. 13 illustrates an example in which a display apparatus according to embodiments is applied to a mobile device. The mobile device 9100 may include a display apparatus 9110, and the display apparatus 9110 may include the above-described driving circuit, micro semiconductor light emitting device, side reflection structure, bottom reflection structure, and the like. The display apparatus 9110 may have a foldable structure, for example, a multi-foldable structure.

Figure 14:
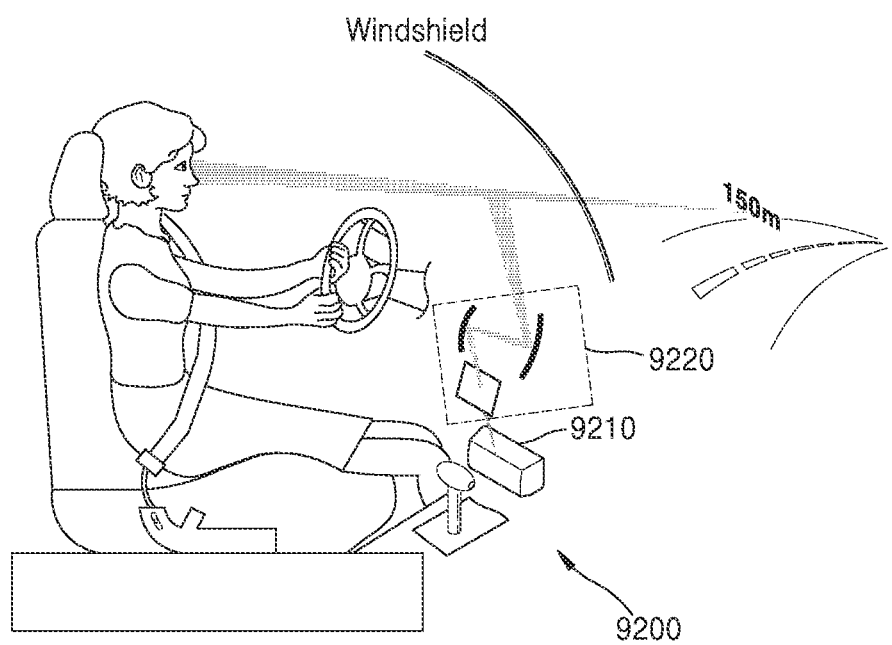
FIG. 14 illustrates an example of applying a display apparatus according to embodiments to a vehicle display apparatus.

FIG. 14 illustrates an example in which the display apparatus according to embodiments is applied to a vehicle display apparatus. The display apparatus may be a vehicle head-up display apparatus 9200, and may include a display 9210 provided in an area of the vehicle, and a light path changing member 9220 that converts an optical path so that the driver may see the image generated on the display 9210.

Figure 15:
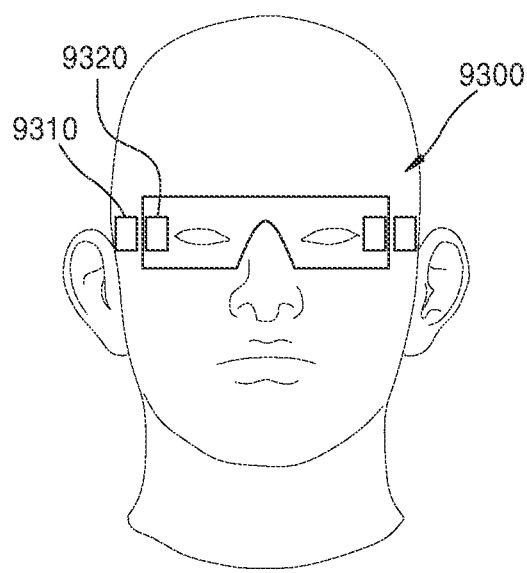
FIG. 15 illustrates an example of applying a display apparatus according to embodiments to augmented reality glasses or virtual reality glasses.

FIG. 15 illustrates an example in which a display apparatus according to embodiments is applied to augmented reality glasses or virtual reality glasses. The augmented reality glasses 9300 may include a projection system 9310 that forms an image, and an element 9320 that guides the image from the projection system 9310 into the user's eye. The projection system 9310 may include the above-described driving circuit, micro semiconductor light emitting device, side reflection structure, bottom reflection structure, and the like.

Figure 16:
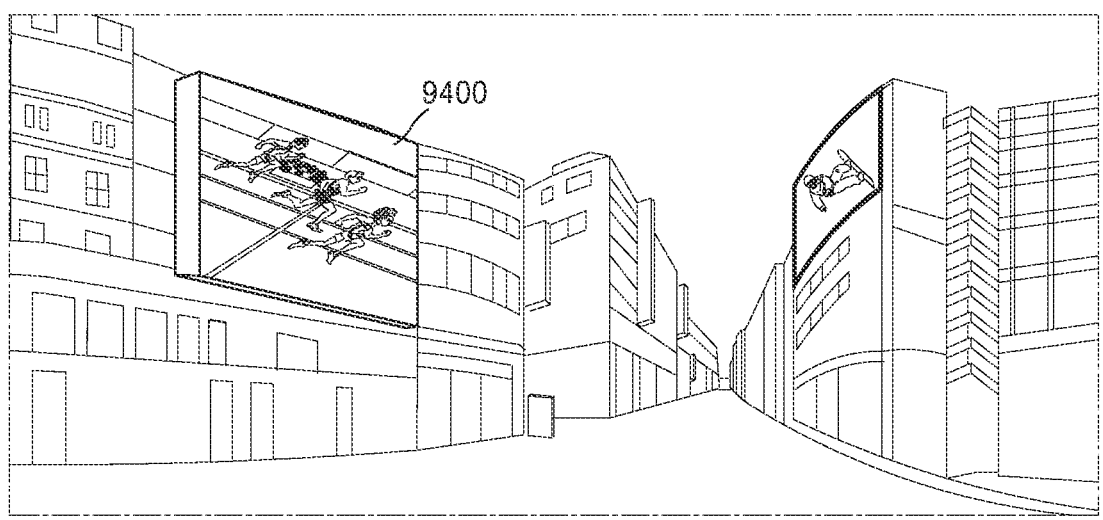
FIG. 16 illustrates an example of applying a display apparatus according to embodiments to a signage.

FIG. 16 illustrates an example in which a display apparatus according to embodiments is applied to a signage. A signage 9400 may be used for outdoor advertisement using a digital information display, and may control advertisement contents and the like through a communication network. The signage 9400 may be implemented, for example, through the electronic device described with reference to FIG. 12.

Figure 17:
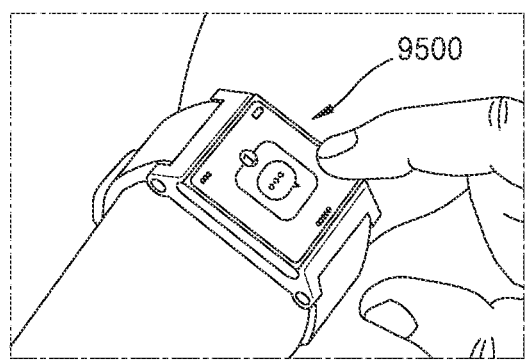
FIG. 17 illustrates an example of applying a display apparatus according to embodiments to a wearable display.

FIG. 17 illustrates an example in which a display apparatus according to embodiments is applied to a wearable display. The wearable display 9500 may include the above-described driving circuit, micro semiconductor light emitting device, side reflection structure, bottom reflection structure, and the like, and may be implemented through the electronic device described with reference to FIG. 12.

The display apparatus according to embodiments may also be applied to various products such as a rollable TV and a stretchable display.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A nanorod light emitting device comprising:
   a semiconductor light emitting nanorod;
   a passivation film surrounding a sidewall of the semiconductor light emitting nanorod and having insulating properties,
   wherein the passivation film comprises an insulating crystalline material having a substantially same crystal structure as a crystal structure of the semiconductor light emitting nanorod, an amorphous insulating layer directly in contact with a sidewall of the passivation film; and further comprising a protective film disposed between the semiconductor light emitting nanorod and the passivation film to directly surround the sidewall of the semiconductor light emitting nanorod, wherein the protective film comprises an insulating crystalline material having the substantially same crystal structure as the crystal structure of the semiconductor light emitting nanorod, wherein an energy bandgap of the protective film is greater than an energy bandgap of the semiconductor light emitting nanorod, and wherein an energy bandgap of the passivation film is greater than or equal to the energy bandgap of the protective film.

2. The nanorod light emitting device of claim 1,
wherein the passivation film has a lattice matching epitaxy relationship or a domain matching epitaxy relationship with the semiconductor light emitting nanorod.

3. The nanorod light emitting device of claim 2,
wherein a difference between a lattice constant of the passivation film and a lattice constant of the semiconductor light emitting nanorod is within +30% of the lattice constant of the semiconductor light emitting nanorod.

4. The nanorod light emitting device of claim 2,
wherein a difference between a lattice constant of the passivation film and an integer multiple of a lattice constant of the semiconductor light emitting nanorod is within +30% of the lattice constant of the semiconductor light emitting nanorod.

5. The nanorod light emitting device of claim 1,
wherein an energy bandgap of the passivation film is greater than an energy bandgap of the semiconductor light emitting nanorod.

6. The nanorod light emitting device of claim 1,
wherein the passivation film comprises at least one from among ZrO, SrO, MgO, BaO, $CeO_2$, $Gd_2O_3$, CaO, $HfO_2$, $TiO_2$, $AlO_x$, BaN, SiN, TiN, CeN, AlN, ZnSe, ZnS, AlGaN, and $Al_xGa_{1-x}As$ (x≥0.9).

7. The nanorod light emitting device of claim 1,
wherein a thickness of the passivation film is in a range of about 5 nm to about 20 nm.

8. The nanorod light emitting device of claim 1,
wherein a thickness of the protective film is in a range of about 0.5 nm to about 5 nm and smaller than a thickness of the passivation film.

9. The nanorod light emitting device of claim 1,
wherein a thickness of the insulating film is in a range of about 40 nm to about 70 nm.

10. The nanorod light emitting device of claim 1,
wherein an energy bandgap of the insulating film is greater than an energy bandgap of the passivation film.

11. The nanorod light emitting device of claim 1, wherein the semiconductor light emitting nanorod comprises:
a first semiconductor layer doped with a first impurity of a first conductivity type;
a light emitting layer disposed on the first semiconductor layer; and
a second semiconductor layer disposed on the light emitting layer and doped with a second impurity of a second conductivity type electrically opposite to the first conductivity type.

12. The nanorod light emitting device of claim 11,
wherein the semiconductor light emitting nanorod further comprises a transparent electrode disposed on the second semiconductor layer.

13. The nanorod light emitting device of claim 1,
wherein the semiconductor light emitting nanorod has a height in a range of about 1 μm to about 20 μm, and an outer diameter in a range of about 0.05 μm to about 2 μm.

14. A display apparatus comprising:
a pixel electrode;
a common electrode;
a nanorod light emitting device disposed between the pixel electrode and the common electrode,
wherein the nanorod light emitting device comprises:
a semiconductor light emitting nanorod; and
a passivation film surrounding a sidewall of the semiconductor light emitting nanorod and having insulating properties, and
wherein the passivation film comprises an insulating crystalline material having a substantially same crystal structure as a crystal structure of the semiconductor light emitting nanorod, and
an amorphous insulating layer directly in contact with a sidewall of the passivation film, and
wherein the nanorod light emitting device further comprises a protective film disposed between the semiconductor light emitting nanorod and the passivation film to directly surround the sidewall of the semiconductor light emitting nanorod,
wherein the protective film comprises an insulating crystalline material having the substantially same crystal structure as the crystal structure of the semiconductor light emitting nanorod,
wherein an energy bandgap of the protective film is greater than an energy bandgap of the semiconductor light emitting nanorod, and
wherein an energy bandgap of the passivation film is greater than or equal to the energy bandgap of the protective film.

15. A cylindrical light emitting device comprising:
a first cylindrical semiconductor layer;
a second cylindrical semiconductor layer;
a cylindrical active layer between the first cylindrical semiconductor layer and the second cylindrical semiconductor layer; and
a passivation film surrounding a sidewall of the cylindrical active layer,
wherein the passivation film comprises an insulating crystalline material, and
an amorphous insulating layer directly in contact with a sidewall of the passivation film, and
wherein the first cylindrical semiconductor layer, the second cylindrical semiconductor layer, the cylindrical active layer, and the passivation film have a substantially same crystal structure,
the cylindrical light emitting device further comprising a protective film disposed between the second cylindrical semiconductor layer and the passivation film to directly surround the sidewall of the second cylindrical semiconductor layer,
wherein the protective film comprises an insulating crystalline material having the substantially same crystal structure as the crystal structure of the second cylindrical semiconductor layer, and wherein an energy bandgap of the passivation film is greater than or equal to the energy bandgap of the protective film.

16. The cylindrical light emitting device of claim 15, wherein the cylindrical light emitting device has a height in a range of about 1 μm to about 20 μm, and an outer diameter in a range of about 0.05 μm to about 2 μm.

\* \* \* \* \*